(12) United States Patent
Lopatinsky et al.

(10) Patent No.: US 7,021,894 B2
(45) Date of Patent: Apr. 4, 2006

(54) APPARATUS FOR COOLING OF ELECTRONIC COMPONENTS

(75) Inventors: Edward Lopatinsky, San Diego, CA (US); Dan Schaefer, Palm Desert, CA (US); Saveliy Rosenfeld, San Diego, CA (US); Lev Fedoseyev, El Cajon, CA (US)

(73) Assignee: Rotys Inc., San Diego, CA (US)

( * ) Notice: Subject to any disclaimer, the term of this patent is extended or adjusted under 35 U.S.C. 154(b) by 104 days.

(21) Appl. No.: 10/355,864

(22) Filed: Jan. 31, 2003

(65) Prior Publication Data

US 2005/0002163 A1    Jan. 6, 2005

Related U.S. Application Data

(60) Provisional application No. 60/356,484, filed on Feb. 13, 2002.

(51) Int. Cl.
*F04D 29/58*    (2006.01)
*H05K 7/20*    (2006.01)

(52) U.S. Cl. ............... 415/176; 415/178; 415/53.2; 361/697; 165/122; 416/3

(58) Field of Classification Search ............ 415/176, 415/177, 178, 53.2, 53.1, 53.3, 211.2, 211.1, 415/183, 185, 186, 191; 416/3; 361/697; 165/120, 121, 122
See application file for complete search history.

(56) References Cited

U.S. PATENT DOCUMENTS

| | | | | |
|---|---|---|---|---|
| 5,936,646 A | * | 8/1999 | Kenny et al. | 361/697 |
| 6,111,748 A | * | 8/2000 | Bhatia | 415/177 |
| 6,873,069 B1 | * | 3/2005 | Odagiri et al. | 415/178 |

* cited by examiner

*Primary Examiner*—Edward K. Look
*Assistant Examiner*—Richard A. Edgar (57) ABSTRACT

An apparatus for cooling of electronic components of the present invention are provided with a heatsink and a blower with an electric drive. The heatsink comprises a base and heat exchanging means. The electric drive comprises a stator and a rotor with an axle; the stator is rigidly built-in to the heatsink. The blower comprises a radial type magnetized impeller as the rotor. The base provides thermal contact with the electronic component and the heat exchanging means. The base is comprised of at least two layers composite material thereof including at least one layer of electrically insulating material and at least one layer of thermally and electrically conductive material that including the stator.

10 Claims, 14 Drawing Sheets

Fig. 12

APPARATUS FOR COOLING OF ELECTRONIC COMPONENTS

CROSS REFERENCE TO RELATED APPLICATIONS

The present application claims the benefit of priority of U.S. Provisional Patent Application Ser. No. 60/356,484, filed Feb. 13, 2002 for Edward Lopatinsky at al. the entire content of which is incorporated herein by reference.

FIELD OF THE INVENTION

The present invention relates generally to cooling devices and in particular, to cooling devices used for removing heat from electronic components by means of a gas flow, in particular air produced by a blower.

BACKGROUND OF THE INVENTION

During normal operation many electronic components generate significant amounts of heat. If this heat is not continuously removed the electronic component may overheat resulting in damage and/or a reduction in operating performance. In order to avoid such problems cooling devices are often used in conjunction with these components.

One such cooling device is a fan assisted heatsink. In such a device a heatsink is formed from a material, such as aluminum, which readily conducts heat. The heatsink is usually placed on top of and in physical contact with the component.

One method of increasing the cooling capacity of these heatsinks is by including a plurality of cooling fins that are physically connected to the heatsink. These fins serve to increase the surface area of the heatsink and, thus maximize the transfer of heat from the heatsink to the surrounding atmosphere. In this manner the heatsink draws heat away from the component and transfers the heat into the surrounding air.

In order to further enhance the cooling capacity of a heatsink device an electrically powered blower (an axial fan may serve as the blower) is often mounted within or on top of the heatsink. In operation the fan forces air to move past the fins of the heatsink, thus cooling the fins by enhancing the transfer of heat from the fins into the surrounding atmosphere. As air flows by the fins, heat can be drawn from the component into the heatsink at a faster rate. The fan typically draws air into the heatsink from the top, passes the air over the fins, and exhausts the air in the vicinity of the bottom. Accordingly, the exhaust air is hotter than that of the intake air.

There are known devices of this type, for example, U.S. Pat. No. 6,196,300 "Heatsink". The device described in this U.S. patent comprises an axial fan that produces a flow passing by heat exchanging channels of the heatsink. The majority of inlets to the heat exchanging channels are located just opposite the axial fan's impeller with a certain number of said channels being placed radially in relation to the fan axle.

The axial fan produces a sufficiently air pressure. However, due to the weak airflow in the area adjacent to fan axle, the conditions for cooling the central part of the heatsink located underneath the fan are unfavorable. In this case non-uniform cooling of the heatsink and electronic component will take place allowing for bad conditions for the heat exchange process.

Centrifugal blowers are used more rarely in cooling device designs for the purpose of producing airflow.

Specifically, U.S. Pat. No. 5,838,066 "Miniaturized cooling fan type heatsink for semiconductor device" offers a design employing a centrifugal blower that is installed to the side of the heatsink. In one particular embodiment of this invention the cooling airflow passes by rectilinear means through the heat exchanging channels of the heatsink.

However, placement of a centrifugal blower to the side of the heatsink increases the devices size and reduces its effectiveness. This is because the location of the centrifugal blower leads to insufficient coordination between the direction of channel inlets and direction of airflow supplied from the blower. The loss in airflow energy results in the reduction of airflow speed in the heat exchanging channels and the reduction of heat exchange efficiency. A portion of energy is also expended as friction against the casing that encloses the blower.

An invention described in Japanese patent No. 8-195456 entitled "Cooler for electronic apparatus" discloses a centrifugal fan enclosed in a casing and installed above the heat exchanging channels which are divergent. Another heatsink surface is made so that the possibility of thermal contact with an electronic component is provided for. The inlet of the centrifugal fan faces the heatsink. The fan produces an airflow that passes by the heat exchanging channels and then gets drawn into the inlet of the centrifugal fan. Since this centrifugal fan operates by drawing air in through the heatsink, there is an area in the central part of the heatsink that receives poor air circulation. Adding to this problem, the airflow first passes through the elongated heat exchanging channels gathering heat along the way from the channels surfaces. As the air approaches the central part of the heatsink its cooling ability is decreased due to the reduced temperature differential between the preheated channel air temperature and the surface temperature at the center of the heatsink. This results in inefficient cooling of the heatsink's central surface area and uneven cooling of the heatsink in general. This is the area where the electronic component is transferring the most heat to the heatsink and where the greater differential between the two is most important. To help correct this problem, one has to increase the fans power resulting in an increased airflow but not solving the initial problem. In addition to the heat dissipation problems, the device is considerably larger due to the centrifugal fans placement above the heatsink. An electric drive also is yet placed above the centrifugal fan increasing the coolers overall size even more.

Additionally methods of producing these conventional coolers are very complicated because the heatsinks, the fans and the electric drives are produced separately.

It would be desirable to provide a cooling apparatus that would overcome these problems associated with the present fan assisted heatsink devices by producing an integrated apparatus, which serves all these disparate functions.

DESCRIPTION OF ILLUSTRATIVE EMBODIMENTS OF THE INVENTION

The invention is based on the recognition that a heatsink and a blower with an electric drive are provided in a single integrated apparatus for cooling of electronic components such as integrated semiconductor chip. The formation of a stator of the electric drive into the heatsink permits a significant simplification and reduction in size, which also provides for more uniform cooling of an electronic device, than has been achieved hitherto.

Specifically, an apparatus for cooling of electronic components comprises a heatsink and a blower with an electric drive. The heatsink comprises a base and heat exchanging means, and the electric drive comprises a stator and a rotor, the stator rigidly built-in to the heatsink. The blower comprises a magnetized impeller as the rotor. The base provides thermal contact with the electronic component and the heat exchanging means.

The base may be comprised of at least two layers of composite material thereof including at least one layer of electrically insulating material and at least one layer of thermally and electrically conductive material provides thermal contact with the electronic component; the stator rigidly built-in to the layer of thermally and electrically conductive material.

The layer of electrically insulating material may be also comprised of electrically insulating and thermally conductive material.

The heat exchanging means may be pins and/or fins in contact with the base.

The apparatus may further comprise a cover or housing serving as an air guide, said cover or housing may further comprise an additional stator.

The magnetized impeller may be a radial type impeller.

Preferably the base comprises two layers of thermally and electrically conductive material and one layer of electrically insulating material located between these two layers. The layer of thermally and electrically conductive material nearest to the electronic component interconnects the pins with each other.

The magnetized impeller serves as the rotor of the electric drive and is a radial type impeller with magnetized blades, for example, and is installed on the axle. A tip of each, or at least some of the impeller blades are magnetized in the direction parallel to the axle.

According to the present invention cooling air is introduced into the inlet, located above the heatsink, by means of a radial blower with blades located around the pins of the heatsink. This blower is driven by a brushless type DC electric drive that utilizes a ring type permanent magnet rotor. This rotor has an opening in the center allowing for the transfer of incoming air to the center of the heatsink. When the electric current flows through the stator, the stator coils acquire a magnetic polarity. The poles of the magnetized rotor and stator coils attract and repel depending on the polarities. This action provides for a smooth continuous directional electric drive rotation.

An apparatus for cooling of electronic components, lacking space for incoming cooling air above the blower, comprises the heatsink with at least two fins installed on the base and connected with the cover and serve as outer guide vanes for crossflow type blower. These two fins form an inlet and an outlet inside the heatsink. In this case the radial type impeller with the electric drive operates as crossflow type blower.

According to this embodiment of the invention, rotation of the magnetized impeller generates a cooling air flow to the inlet of the heatsink, in a direction parallel to the base, through the radial type impeller and the outlet of the heatsink in series way in a direction parallel to the base as well. While the cooling air flows through the apparatus for cooling of electronic components, the intensive heat exchange process take place while the cooling air flows around heat exchanging means.

As well according previous embodiments the radial type impeller is positioned on the heatsink so that the blades of the radial type impeller surround the heat exchanging means like pins. The cover plate may comprise additional stator boards with coils. In the central part of the heatsink may be installed inner guide vane made as fins.

DETAILED DESCRIPTION OF THE EMBODIMENTS

Two embodiments of the present invention will be described in detail below with reference to the accompanying drawings.

FIGS. 1–8, 8a show a first embodiment and FIGS. 9–12 show a second embodiment of the present invention.

An apparatus 1 (FIGS. 1–4) for cooling of the electronic component 2 (FIG. 8) comprises a heatsink 3, a blower 4 and an electric drive 5. The heatsink 3 (FIGS. 1, 3 and 5) has a base 6 on which a plurality of heat exchange means 7 like pins 13 are formed. A lower surface of the base 6 is attached to a heat radiating surface of the electronic component 2 (FIG. 8), for example, such as a semiconductor device, a CPU, a microprocessor or the like by, for example, an adhesive.

The electric drive 5 (FIG. 7) comprises a stator 8 and a rotor 9, the stator 8 rigidly built-in to the heatsink 3, for example by using a printed circuit board technology.

The blower 4 comprises a magnetized impeller 10 as the rotor 9.

The base 6 comprises two layers of composite material thereof including one layer of electrically insulating material 11, for example, fiberglass, and one layer of thermally and electrically conductive material 12, for example, copper, provides thermal contact with the electronic component 2;

the stator 8 rigidly built-in to the layer of thermally and electrically conductive material 12. The layer of electrically insulating material 11 being also comprised of electrically insulating and thermally conductive material, for example, resin including polypropylene. It is preferable that the base 6 comprised of two layers of thermally and electrically conducting material 12 and 12a and one layer of electrically insulating material 11 located between mentioned layers 12 and 12a (FIGS. 1, 3, 5, 7 and 8a).

Figure 1:
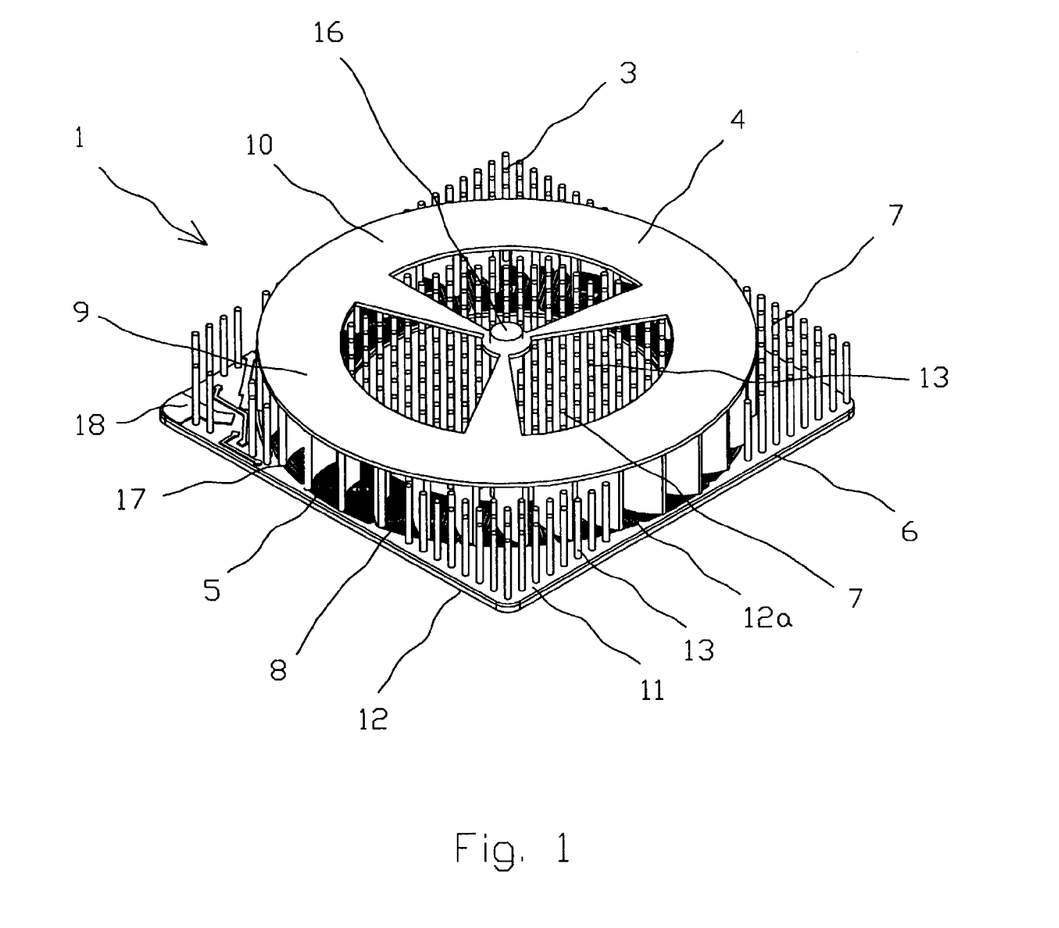
FIG. 1 is a perspective view showing a first embodiment of the present invention.
Figure 1A:
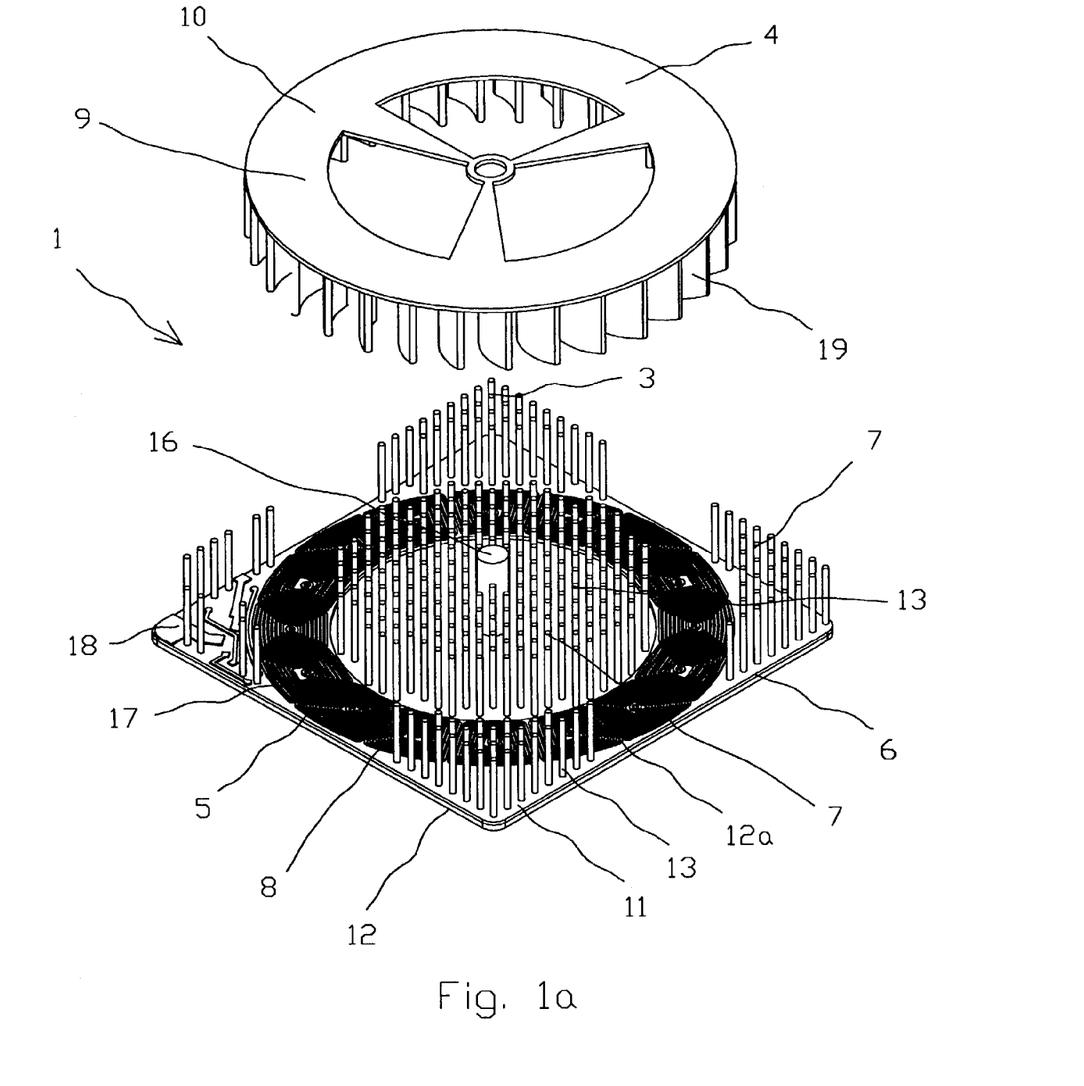
FIG. 1a is an exploded view showing a first embodiment of the present invention.
Figure 2:
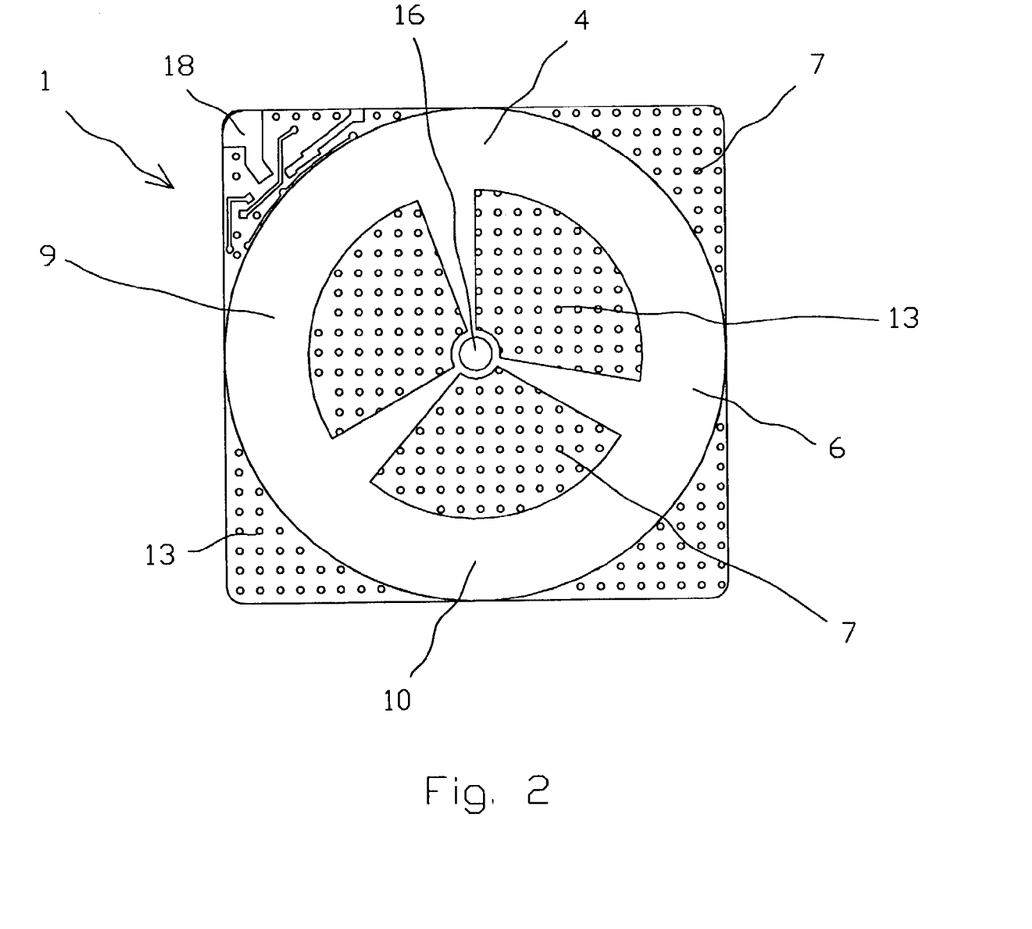
FIG. 2 is a top plan view of the apparatus in accordance with the present invention shown in FIG. 1.
Figure 3:
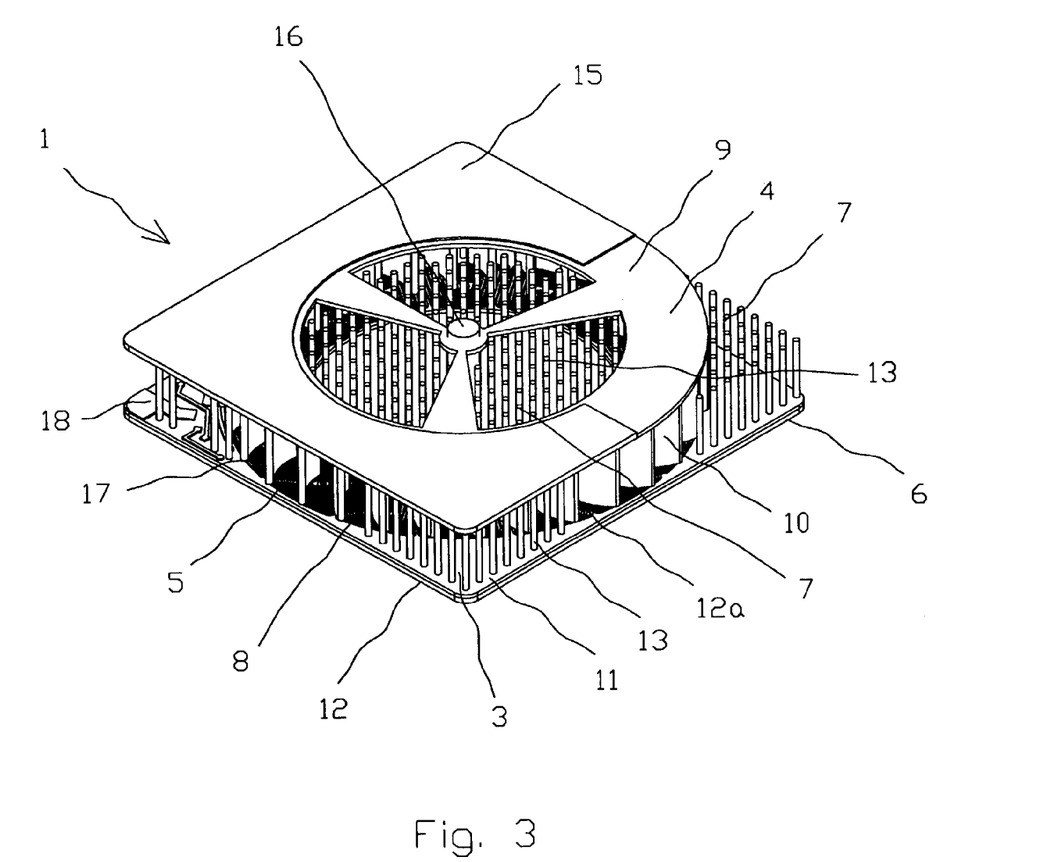
FIG. 3 is a perspective view showing the embodiment of the present invention of FIG. 1 with a cover.
Figure 4:
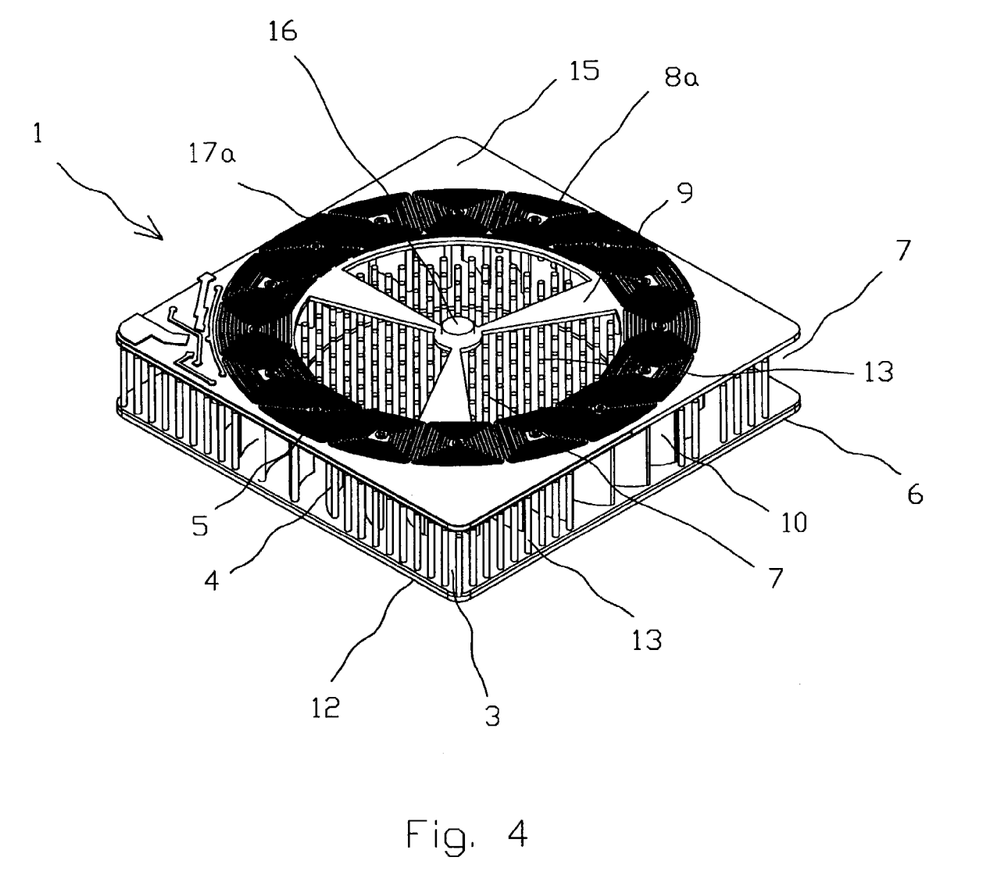
FIG. 4 is a perspective view showing the embodiment of the present invention of FIG. 1 with a cover and additional stator coils thereon.
Figure 5:
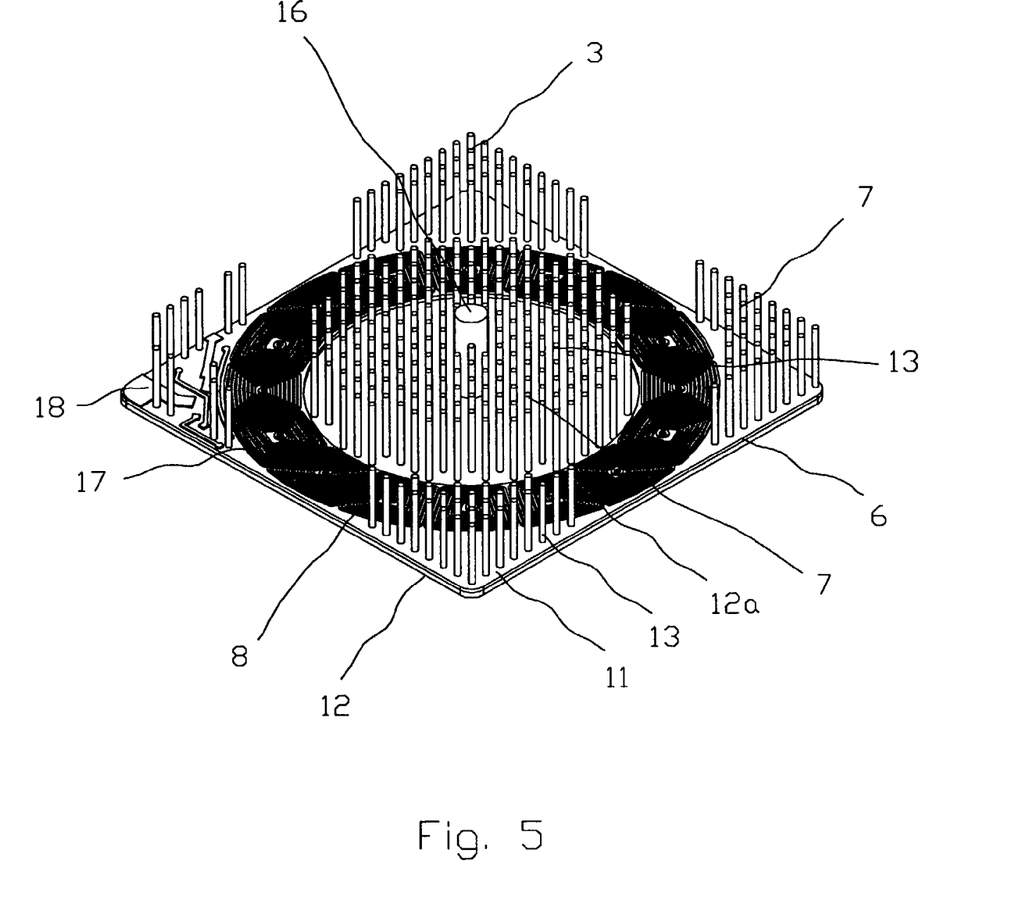
FIG. 5 is a perspective view showing an embodiment of the present invention with a rotor of an electric drive removed from the apparatus.
Figure 6:
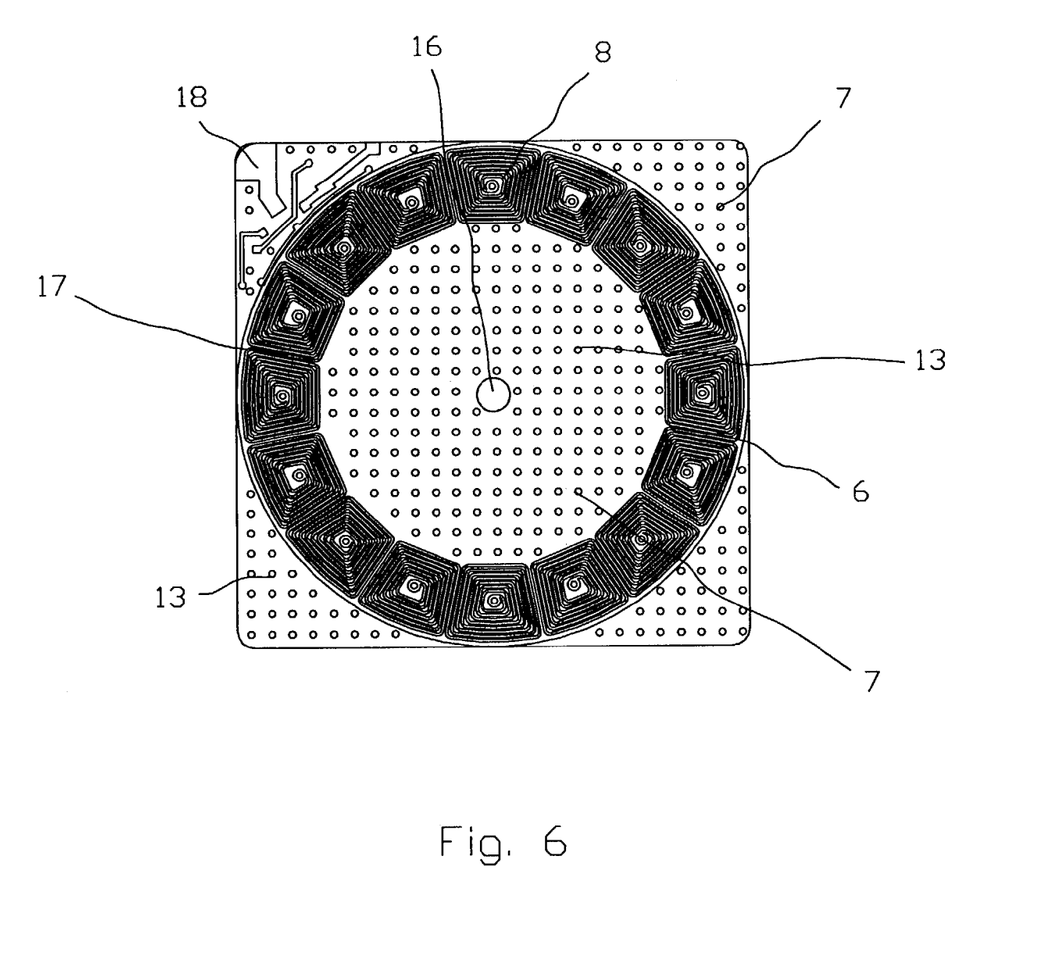
FIG. 6 is a top plan view of the apparatus in accordance with the present invention shown in FIG. 5.

The plurality of the heat exchanging means like pins 13 made of thermally conductive material, for example, of copper, is formed in a central part of the heatsink 3 (FIG. 5). The pins 13 further formed in corners of the heatsink 3. It is possible to make heat exchanging means like fins structure (not shown). The pins 13 are interconnected with each other by the layer of thermally and electrically conductive material 12 (see FIG. 8a). A cover 15 serves as an air guide and covers pins 13 on the corners of the heatsink 3 (FIG. 3). Additionally, the cover 15 may be comprises the additional stator 8a (FIG. 4).

The electric drive (FIG. 7) is a flat rotor type DC brushless motor comprising the stator 8 and the rotor 9 with a ring like hole in a central part (that is the same as the a central inlet of the radial type magnetized impeller 10). This design was described in the U.S. patent application Ser. No. 10/183,032 for the same Assignee, which is hereby incorporated by this reference for all that disclosed therein.

Figure 7:
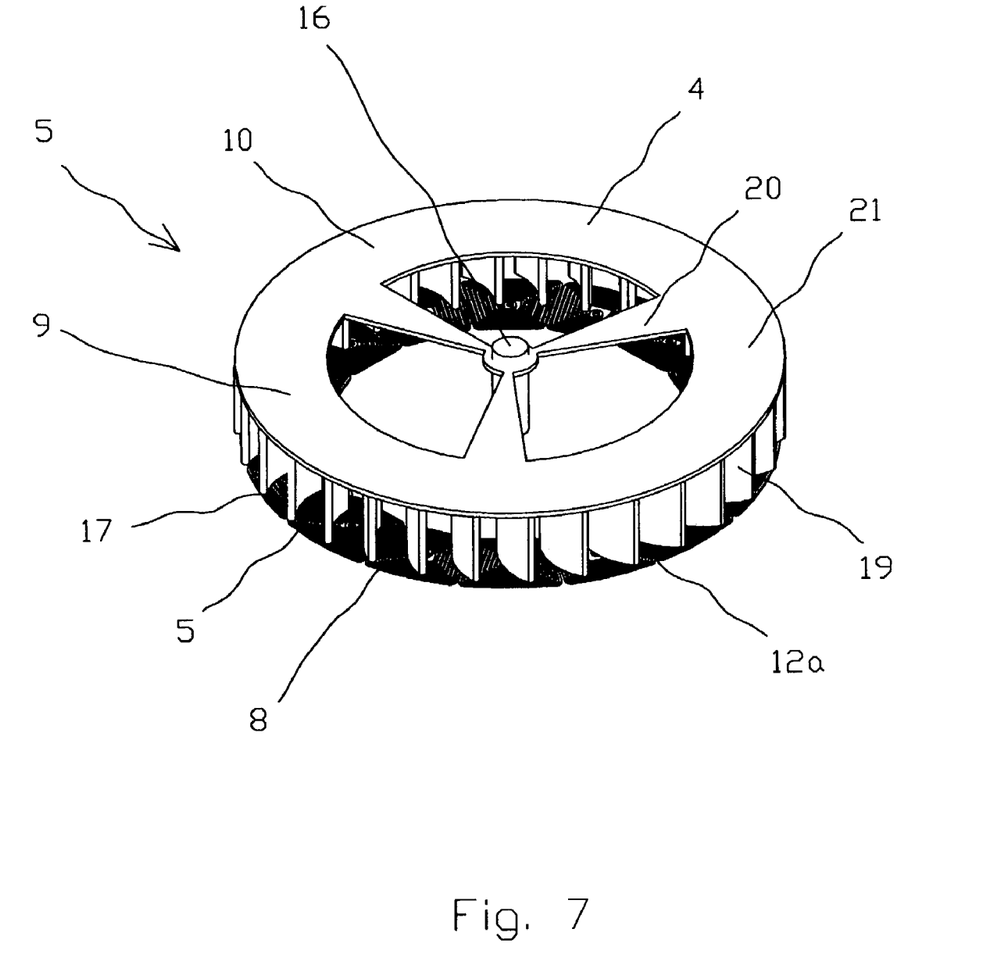
FIG. 7 is a perspective view showing the electric drive removed from the apparatus.

The rotor 9 in the present invention is fashioned in the shape of the radial type magnetized impeller 10 and serves as part of the blower 4.

The stator coils 17 of the stator 8 are arranged in a circular (annular) pattern around an axle 16 of the rotor 9 of the electric drive 5. The stator coils 17 made of the layer of thermally and electrically conducting material 12a and aligns axisymmetrically in respect to the axle 16. The stator coils 17 form a continuous series connection with every adjacent stator coils 17. The series connection is broken between two of the adjacent stator coils 17 for electrical leads attachment. If the electric drive 5 needs additional torque the stator may comprise additional stator 8a with the stator coils 17a. This additional stator 8a with the stator coils 17a may be made on the cover 15 as well (FIG. 4).

The magnetized impeller 10 as the rotor 9 can be made from a magnetic plastic material or some other permanent magnet material. The tip of each individual rotor blade 19 is magnetized in the direction parallel to the axle 16. The number of blades 19 of the rotor 9 must be proportional to the number of stator coils 17 on the stator 8. The number of the stator coils 17 depends on how many electrical phases the electric drive 5 will have. The rotor 9 is installed on the axle 16 with a fixed gap to the stator 8. It is possible to have only blades 19 made from a magnetic plastic material or some other permanent magnet material, or parts of the blades 19 made from a magnetic plastic material or some other permanent magnet material.

The electric drive 5 gains a rotational torque attributed to an interaction between a magnetic field produced by many-pole, magnetized impeller 10 as the rotor 9 and the magnetic field produced by exciting stator coils 17 of the stator 8 so as to be rotated in one direction. The stator coil 17 cores are connected with a controller 18, for example of type Fairchild NDSSS58H.

This described stator 8 is constructed for use with the full bridge drive controller 18. The two-phase single ended driver requires a different designed stator not covered in this description.

The sensing element used to control commutation of this electric drive 5 is a Hall effect switch or Hall effect element. An optical device may also be used but has limitations because of interference from ambient light sources. The Hall device is located in close proximity to the rotor 9 and positioned to achieve proper rotational direction and optimum performance from the electric drive.

The electric drive electronics can be a full bridge drive or a two-phase single ended drive. This stator 8 requires two groups of the stator coils 17 wound in the same direction and having common magnetic polarities. One end of this group of the stator coils 17 is connected together and ties to either the positive or negative lead of the electric drive power supply.

Figure 8:
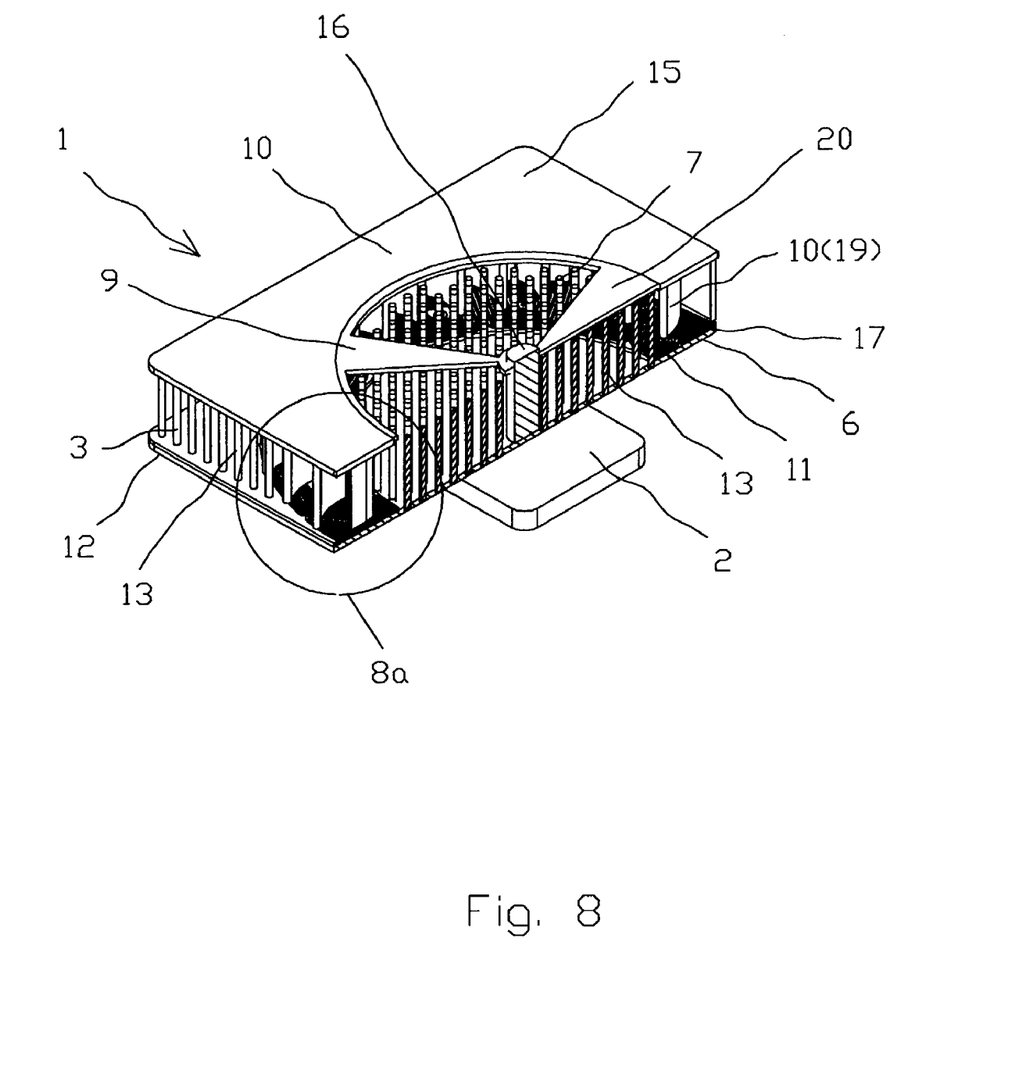
FIG. 8 is a half sectional view of the present invention shown in FIG. 3.
Figure 8A:
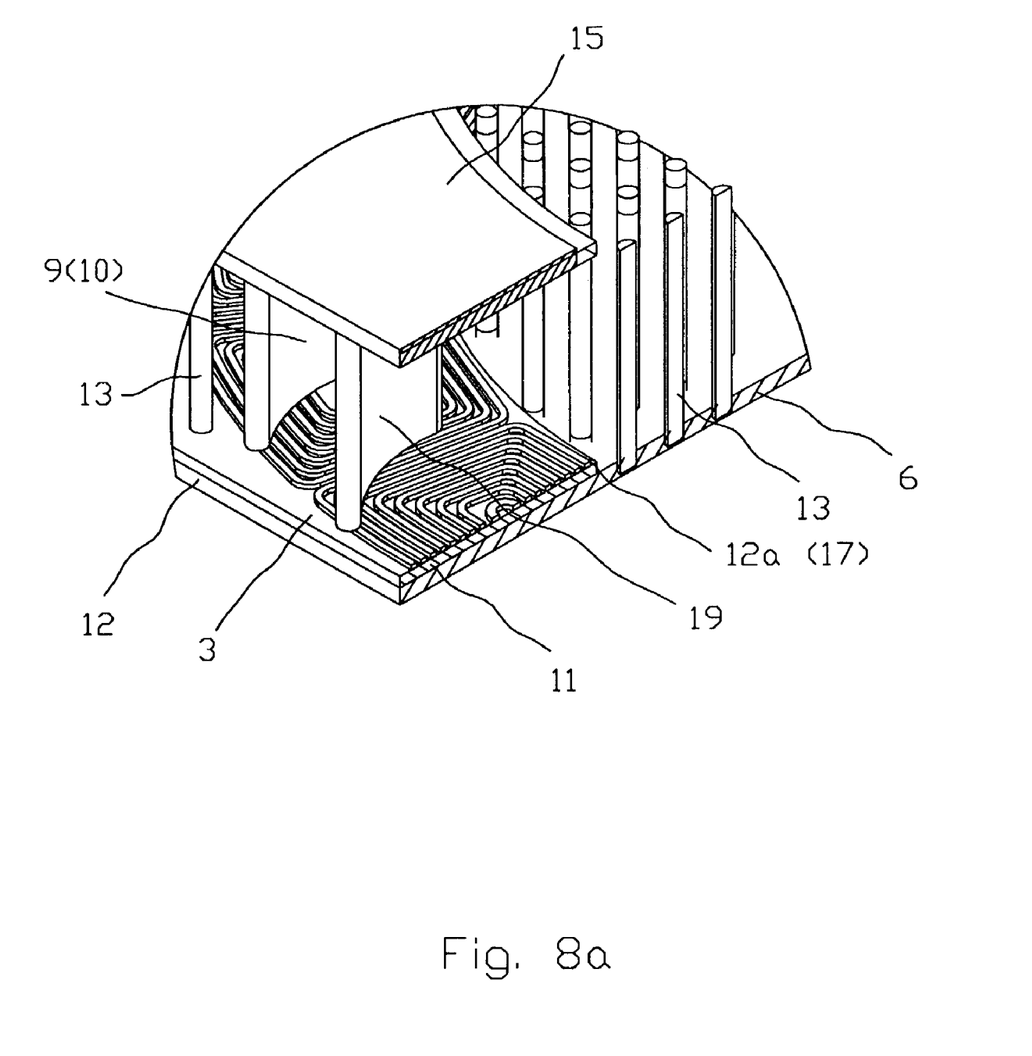
FIG. 8a is an enlarged perspective view of the part 8a shown in FIG. 8.
Figure 9:
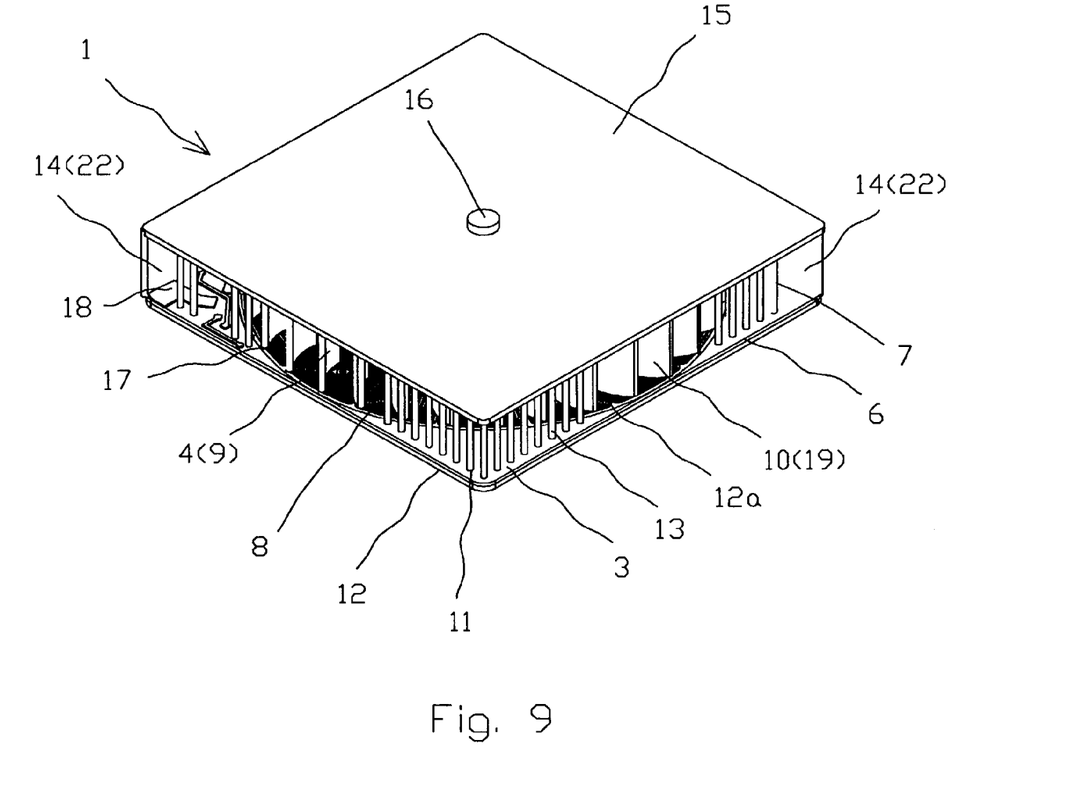
FIG. 9 is a perspective view showing a second embodiment of the present invention.
Figure 10:
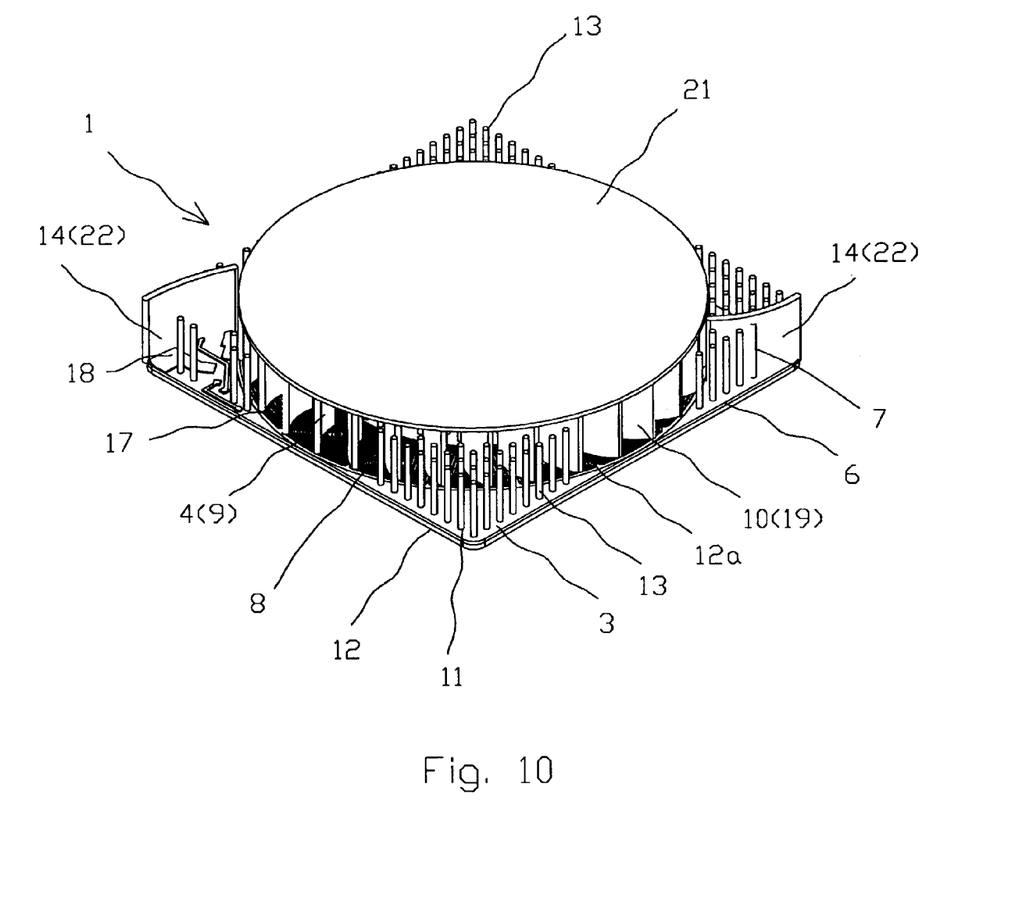
FIG. 10 is a perspective view showing the embodiment of the present invention of FIG. 9 with the apparatus void of a cover.
Figure 11:
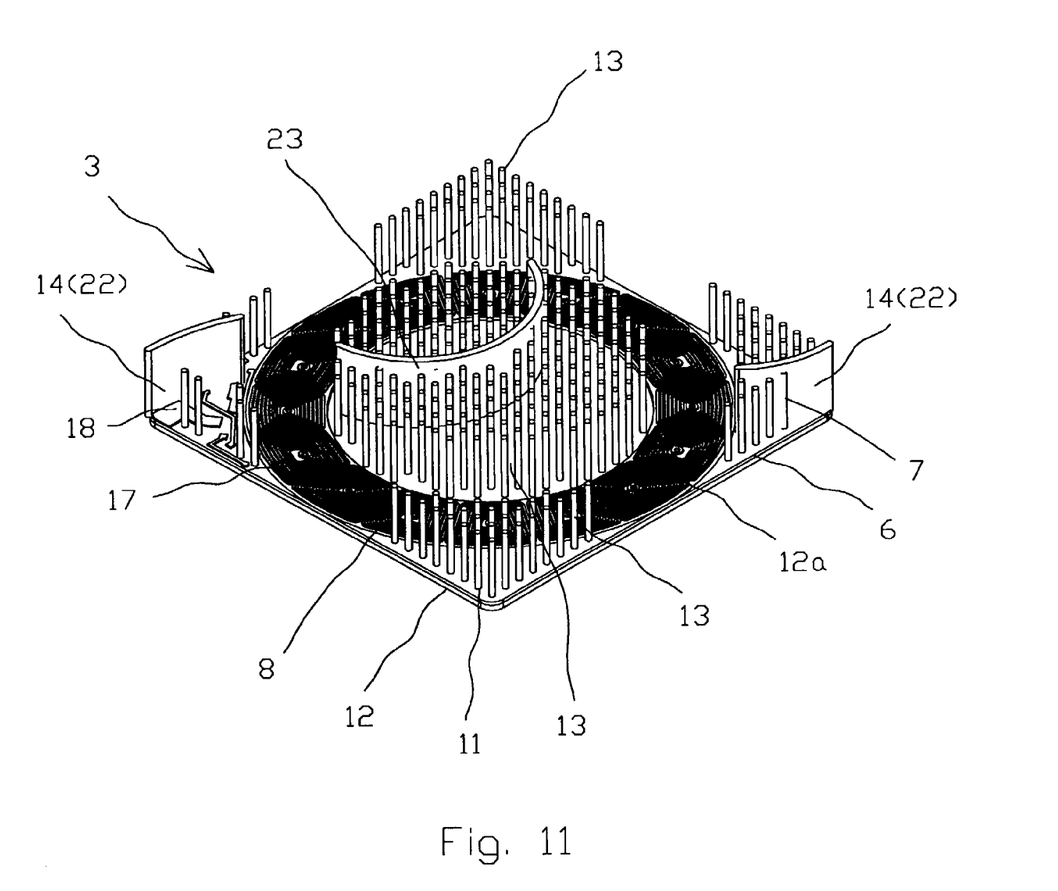
FIG. 11 is a perspective view showing the embodiment of the present invention of FIG. 9 with the rotor of an electric drive removed from the apparatus.

The radial type magnetized impeller 10 comprises a shroud, a hub with the axle 16 and brackets, which may be made in form of axial blades 20 of an axial fan (FIG. 7, 8). The bracket connects the hub with the shroud.

The apparatus 1 for cooling of the electronic component 2 according to present invention is made by using a following method of manufacturing. This method provides several steps:

In the first step according to the present invention the base 6 is made of two layers of composite material including one layer of electrically insulated material 11 such as a fiberglass, and one layer of thermally and electrically conductive material 12 such as a copper. The stator 8 comprises stator coils 17 made by conventional printed circuit board technology on the layer of thermally and electrically conductive material 12 of the base 6. An electrically insulating gap is formed between the stator coils 17 and the central part of the layer of thermally and electrically conductive material 12. A second electrically insulating gap is formed between the outer circumference of the stator coils 17 and other part of the layer of thermally and electrically conductive material 12.

In the second step heat exchanging means 7 as pins 13, and an axle 16 of the rotor 9 are attached through the base 6 and interconnected with each other by said layer of thermally and electrically conductive material 12.

In the third step the central part of the layer of electrically insulated material 11 is deleted thus provides thermal contact with the electronic component 2 and the layer of thermally and electrically conductive material 12.

In the last step the magnetized impeller 10 is mounted on the axle 16.

When the layer of electrically insulated material 11 comprised of electrically insulating and thermally conductive material, the third step is be omitted.

In the first embodiment of the present invention (see FIGS. 8 and 8a) the base 6 comprises two layers of thermally and electrically conductive material 12 and 12a and one layer of electrically insulating material 11 located between these two layers 12 and 12a, and the nearest to the electronic component layer of thermally and electrically conductive material 12 interconnecting pins 13 with each other.

The radial type magnetized impeller 10 (see FIGS. 1–4, 8 and 8a) is positioned on the heatsink 3 so that the centrally located pins 13 are surrounded by the blades 19 of the magnetized impeller 10 and during a rotation of the magnetized impeller 10 a cooling air flows to the blades 19 of the magnetized impeller 10 through pins 13 in the central part of the heatsink 3.

FIGS. 9–12 show the second embodiment of the present invention. An apparatus I for cooling of electronic components comprises in general the same elements as the apparatus 1 in the first embodiment. The same elements have the same position number and description, as in the first embodiment. Accordingly, further description of like components in the second embodiment will be omitted.

The traditional blowers assemblies have an inlet from above the blower that ventilate the entire housing of the device and is less effective in removing heat in some devices where there isn't enough space above the blower. The differences between the first and the second embodiments herein are in the blower is a crossflow type blower 4 and comprises radial type magnetized impeller 10 with blades 19 normal to flat common surface—an impeller disk 21. The heatsink 3 has an upper surface on which a plurality of pins 13 are formed. A lower surface of the heatsink 3 is attached to a heat radiating means—an electronic component (not shown) such as a semiconductor device, for example, a CPU, a microprocessor or the like by, for example, an adhesive.

Figure 12:
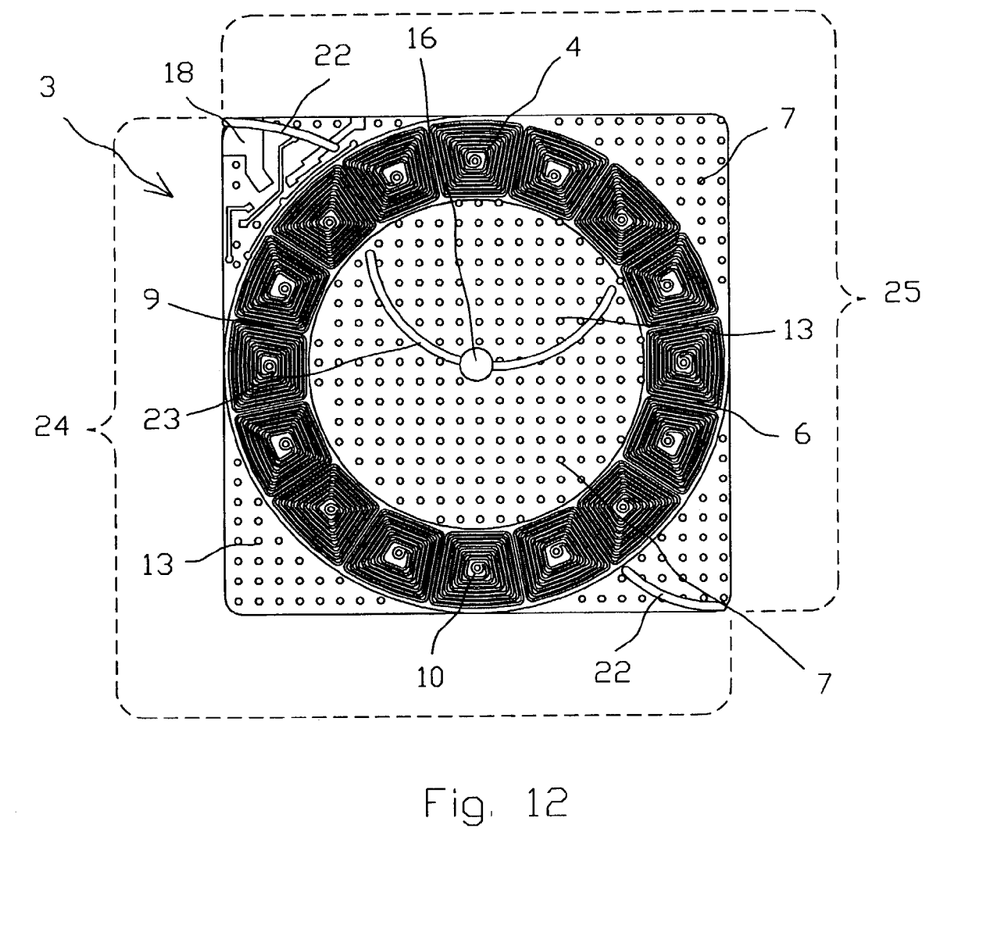
FIG. 12 is a top plan view of the apparatus in accordance with the second embodiment of the present invention shown in FIG. 11.

A plurality of the heat exchanging means as pins 13 made of, for example, copper, is formed in a central part (FIG. 11–12) of the heatsink 3. The pins 13 also formed in corners of the heatsink 3. A cover 15 (FIG. 9) like in the previous embodiment cover pins 13 on the corners of the heatsink 3 and crossflow blower 4. Two outer guide vanes 22 serving as fins 14 are installed on the upper surface of the heatsink 3 and divided the heatsink 3 to an inlet 24 and outlet 25 (FIG. 12). The numerous pins 13 and fins 14 provide a significant surface area for dissipating heat from heatsink 3.

The radial type magnetized impeller 10 is positioned on the heatsink 3 so that the pins 13 are surrounded by the blades 19 of the radial type magnetized impeller 10. Rotation of the magnetized impeller 10 generates a cooling air flow to the inlet 24 of the heatsink 3 in a direction parallel to the base 6, through the radial type magnetized impeller 10 and the outlet 25 of the heatsink 3 in series way in a direction parallel to the base 6. The cooling air flows through the apparatus for cooling of electronic components, the intensive heat exchange process take place while the cooling air flows around heat exchanging means 7.

The cover 15 may comprise (not shown) an additional stator 8*a* with stator coils 17*a* like at the first embodiment. The inner guide vane 23 may be installed in the central part of the heatsink 3. What has been described is merely illustrative of the principles of this invention which others skilled in the art, may modify to generate other embodiments within the spirit and scope of the invention encompassed by the following claims.

What is claimed is:

1. An apparatus for cooling of electronic components comprising a heatsink and a blower with an electric drive, wherein
    (i) said heatsink comprising a base and heat exchanging means;
    (ii) said electric drive comprising a stator and a rotor with an axle, said stator being integrated with said base;
    (iii) said blower comprising a magnetized impeller as said rotor;
    (iv) said base providing direct contact with said electronic component and said heat exchanging means.

2. The apparatus as claimed in claim 1, wherein said heat exchanging means are pins and/or fins.

3. The apparatus as claimed in claim 1, wherein said heatsink further comprising a cover serving as an air guide.

4. The apparatus as claimed in claim 3, wherein said cover further comprising an additional stator.

5. The apparatus as claimed in claim 1, wherein said magnetized impeller being a radial type impeller.

6. The apparatus as claimed in claim 5, wherein said heatsink further comprising a cover and at least two fins installed on said base and connected with said cover and serving as outer guide vanes for crossflow type blower.

7. The apparatus as claimed in claim 1, wherein said base comprising at least two layers of composite material thereof including at least one layer of electrically insulating material and at least one layer of thermally and electrically conductive material providing thermal contact with said electronic component; said stator rigidly built-in to said layer of thermally and electrically conductive material.

8. The apparatus as claimed in claim 7, wherein said layer of electrically insulating material being made of thermally conductive material like resin including polypropylene.

9. The apparatus as claimed in claim 7, wherein said layer of electrically insulating material being made of fiberglass.

10. The apparatus as claimed in claim 7, wherein said layer of thermally and electrically conductive material being made of copper.

\* \* \* \* \*